United States Patent [19]
Goenka et al.

[11] Patent Number: 5,702,584
[45] Date of Patent: Dec. 30, 1997

[54] ENHANCED PLATING ADHESION THROUGH THE USE OF METALLIZED FILLERS IN PLASTIC SUBSTRATE

[75] Inventors: Lakhi N. Goenka, Ann Arbor; Michael G. Todd, South Lyon; Andrew Z. Glovatsky, Ypsilanti, all of Mich.

[73] Assignee: Ford Motor Company, Dearborn, Mich.

[21] Appl. No.: 675,308

[22] Filed: Jul. 1, 1996

[51] Int. Cl.$^6$ .............. C25D 5/54; C25D 5/56; B05D 3/04

[52] U.S. Cl. .......... 205/158; 205/164; 205/168; 205/169; 205/187; 205/210; 216/7; 216/33; 216/35; 427/307

[58] Field of Search ................ 205/158, 164, 205/168, 169, 187, 210; 216/7, 33, 35; 427/307

[56] References Cited

U.S. PATENT DOCUMENTS

| 4,349,421 | 9/1982 | Khattab | 205/168 |
| 5,135,773 | 8/1992 | Suzuki | 427/307 |

OTHER PUBLICATIONS

Book: Author—Frederick A. Lowenheim. "Electroplating" published by McGraw Hill, copyright 1978, pp. 416 through 425.

Primary Examiner—Kathryn L. Gorgos
Assistant Examiner—Edna Wong
Attorney, Agent, or Firm—Damian Porcari

[57] ABSTRACT

A polymer substrate is plated with a metal, using metallic filler particles in the polymer as anchorage points for a layer of metal formed by an electroless plating operation. The polymer has a filler that includes non-metallic filler particles and metallic filler particles; the non-metallic filler particles contiguous to the polymer surface can be etched away, so as to expose metallic filler particles proximate to the etched surfaces. The exposed metallic filler particles serve as anchorage points for the electroless plate layer.

5 Claims, 2 Drawing Sheets

ENHANCED PLATING ADHESION THROUGH THE USE OF METALLIZED FILLERS IN PLASTIC SUBSTRATE

BACKGROUND OF THE INVENTION

1. Field of the Invention

This invention relates to a process for plating metal (e.g. copper 10 or nickel), on a plastic substrate. The process involves the employment of metallized fillers within the plastic substrate that act as anchorages for the plated material, where by the plating has enhanced adhesion to the polymer substrate. Various polymers can be utilized in practice of the invention.

2. Description of the Related Prior Art

It is known that metals can be plated onto polymers, using fillers that are etchable to create pores and cavities in the substrate surface. Electroless plating of a metal onto the etched surface creates mechanical interlocks between the metal and the cavity surfaces. The adhesion is related to the number and extent of the cavities.

A shortcoming of conventional plating process is that the etching action is not able to provide cavities beyond approximately ten to twenty five microns below the substrate surface. The relatively shallow cavities do not provide optimum adhesion of the metal to the plastic substrate. Conventional processes rely on mechanical interlocks between the metal and plastic; such mechanical interlocks may, in some cases, not be sufficient.

SUMMARY OF THE INVENTION

The present invention relates to a process for plating metal on a plastic substrate, wherein metallized fillers are used in the polymer to form strong bonding points with the metal. The non-metallic portions of the metallized fillers contiguous to the substrate surface are etched away, e.g. with hydrofluoric acid, so as to expose metallic fillers surfaces. These exposed metallic surfaces act as bonding (anchorage) points for the metal plating material. The etching roughens the surface 25 of the plastic substrate, which further promotes adhesion of the plating material to the substrate surface.

The metal plating operation is a two step plating operation, comprising a first electroless plating step to form a first metal layer on the polymer substrate, and a second electrolytic plating step to form a second metal layer on the first layer.

It is believed that the use of metallized fillers in the polymer will promote, or accelerate, the electroless plating step, in that the exposed metal filler surfaces are more easily plated than the bare polymer surfaces. The exposed metal filler surfaces act as seed points to promote growth of the metal plating within the cavities formed by the etching process. The etching process removes some filler material, revealing metal filler material internal to the polymer surface. Also, some metal particles may be exposed during the initial process used to form the plastic substrate, e.g. the molding process.

Various types of metallized fillers can be employed in practice of the invention, e.g. combinations of metal and non-metal etchable particles bonded together, or metal-coated chopped fibers. The non-metallic portions of the fillers should be selectably etchable for removal from the polymer, to form the desired cavities in the polymer surface. The metallic portions of the fillers can be the same metal that is to be plated onto the polymer, e.g. nickel or copper.

However, the metallic portions of the fillers can be any metal that forms strong bonds with the plated metal.

One preferred filler material comprises chopped filaments of metal-coated fiberglass. When such filaments are incorporated into a polymer substrate, the substrate surface can be etched to remove fiberglass from the filaments contiguous to the substrate surface. The etching process leaves the associated metal sleeves embedded in the substrate, such that the metal plating material can flow into the metal sleeves so as to become anchored to the polymer. The embedded metal sleeves act as anchorages and seed points for the metal plating material.

Further features and details of the inventions will become apparent from the attached drawings and description of an illustrations embodiment of the invention.

BRIEF DESCRIPTION OF THE DRAWINGS

FIG. 1 is taken after the polymer has been molded, or otherwise formed, to its final configuration, but prior to the operation of plating a metal onto the polymer surface.

As shown in FIG. 2, the etch process has removed a slight amount of the polymer, which helps to reveal some of the buried metallic filler particles, e.g. a filler particle 16 in FIG. 2.

DETAILED DESCRIPTION OF THE PREFERRED EMBODIMENTS

Figure 1:
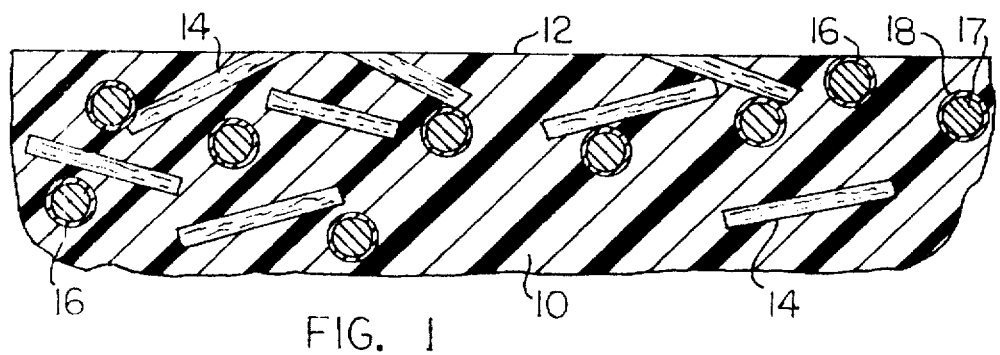
FIG. 1 is a fragmentary sectional view taken through a polymer having metallized fillers incorporated therein according to the present invention.

Referring to the drawings, particularly FIG. 1, there is a shown in fragmentary fashion a molded polymer substrate 10 having metallized fillers randomly dispersed therein. Such fillers are incorporated into the polymer prior to molding or otherwise forming the polymer to its molded configuration. The fillers give the molded plastic component added strength. Additionally, metallized fillers contiguous to the polymer exposed surface 12 provide anchorage points for a metal coating (film) plated onto surface 12 after the surface has been properly chemically prepared.

The plastic article can be formed to a desired configuration, using various known procedures and techniques, e.g. bag molding, casting, injection molding, blow molding, rotational molding, or vacuum forming. The metallized fillers are incorporated into the polymer prior to the operation of forming the polymer into the desired solid configuration.

As shown in FIG. 1, the fillers comprise two types of filler elements referenced by numerals 14 and 16. Filler elements 14 are strands of glass fibers. Filler elements 16 are metallic particles having spherical, or near spherical, shape. Filler elements 16 can be solid copper pellets. However, for some situations it is desired to minimize the electrical conductivity of the polymer; in such cases each spherical pellet (particle) can comprise a core 17 of carbon or glass and a covering 18 of metal (copper, nickel, aluminum, etc.). Each metallic particle 16 serves as a potential anchorage or seed point for metal that is to be plated onto surface 12 of the polymer substrate.

Figure 2:
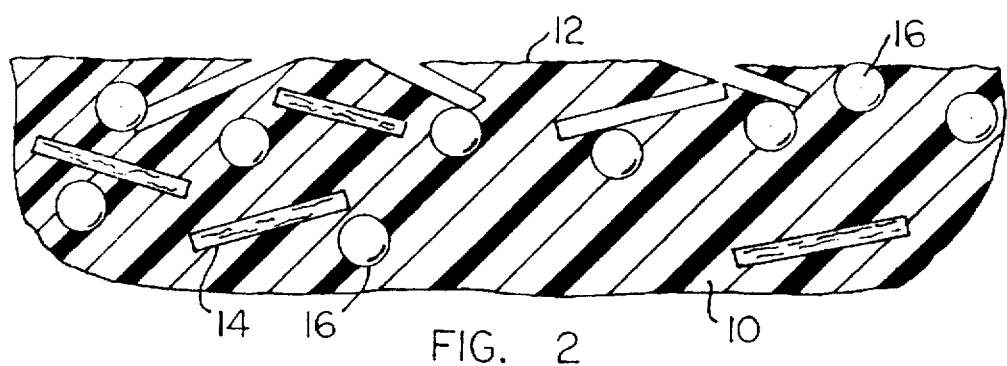
FIG. 2 is a view taken in the same direction as FIG. 1, but after the polymer surface has been etched to remove non-metallic portions of metallized fillers contiguous to the polymer surface.

Prior to incorporating the filler elements 14 and 16 into the polymer substrate, the filler elements can be mixed with an adhesive to cause a significant percentage of filler elements 14 to become adhesively bonded to filler elements 16; the adhesive will be chemically removed by the subsequent etching process (represented in FIG. 2). As shown in FIG. 1, four of the filler elements 14 are connected (attached) to a corresponding number of filler elements 16. The aim is to have an appreciable percentage of the non-metallic filler elements 14 contiguous to polymer surface 12 in direct contact with the associated filler elements 16. If the overall percentage of filler elements 14 and 16 is sufficient it may not be necessary to adhesively attach filler elements 14 to filler elements 16. On a statistical basis, the filler elements 14 will be in contact with filler elements 16 to a significant extent. In preferred practice of the invention the filler materials are added in sufficient quantities as to randomly mix and contact each other.

FIG. 2 shows the polymer after an etching solution has been applied to surface 12 to remove the non-metallic filler elements 14 that are contiguous to surface 12. The etching process roughens and swells the polymer to create plating anchoring sites on the polymer surface. The etching process removes some of the polymer at the polymer surface so that metal filler elements slightly below the surface are exposed, as shown e.g. by the exposed metal particle 16 in FIG. 2. The etching process attacks non-metallic filler elements 14 to form relatively deep cavities in surface 12, whereby metallic filler elements 16 proximate to the deep cavities are exposed. As shown in FIG. 2, the etching process forms four elongated cylindrical cavities and four associated exposed metallic filler elements 16.

Figure 3:
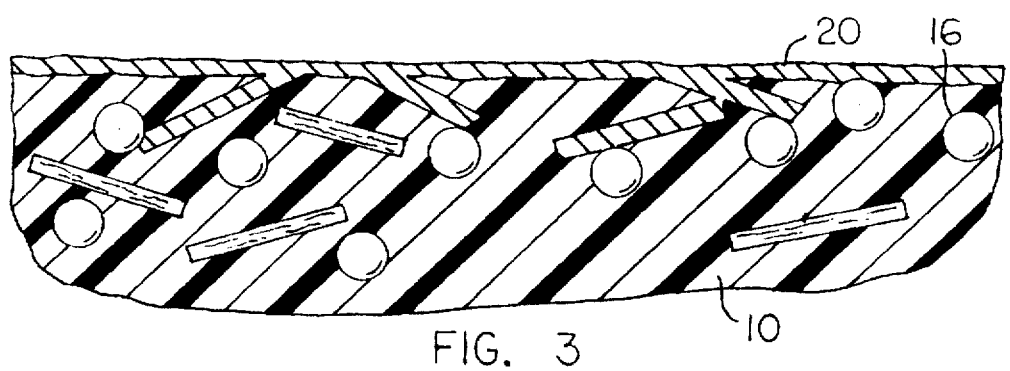
FIG. 3 is a view taken in the same direction as FIG. 2, but after the polymer has been subjected to an electroless metal plating operation.

FIG. 3 shows the polymer after an electroless plating of metal 20 on the substrate surface 12. The plating metal is deposited on surface 12, as well as in the associated cavities. The associated metallic filler particles 16 act as seed points for metal deposition, and as anchorage points for the metal plate layer 20.

Electroless plating is a known process that can be carried out with known metallic solutions, e.g. solutions containing copper or nickel. In the case of nickel plating, a solution of nickel hypophosphite can be used. In the case of copper plating, the copper salt can be copper sulfate pentahydrate. Various complexing agents, reducing agents and pH control solutions may also be necessary.

Prior to the electroless plating operation, it is desirable to catalyze the substrate surface 12, i.e. to make the surface more reactive to the plating material as regards ion connection. Catalyzing materials 10 comprise members of group 7 of the periodic table, including nickel, cobalt and palladium. Catalyzation of the polymer surface is a known procedure used to enhance electroless plating. The present invention is preferably practiced, using the catalyzation procedure in combination with metallized fillers, as shown in FIGS. 1 through 3.

Figure 4:
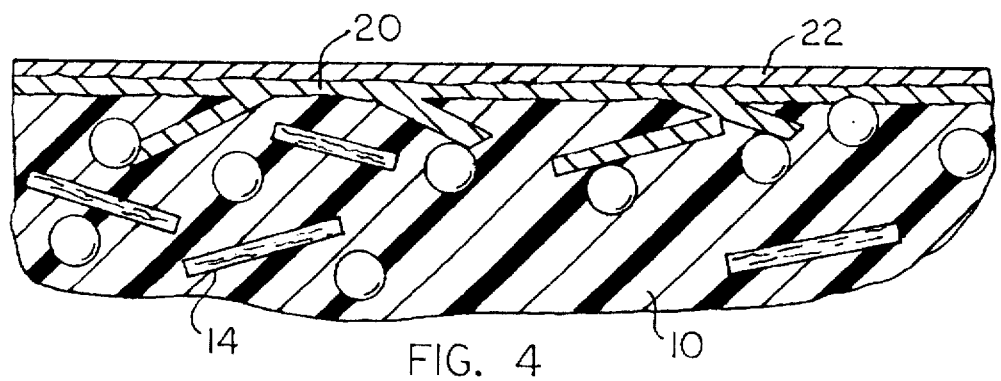
FIG. 4 is a view taken in the same direction as FIG. 3, but after the plated polymer has been subjected an electrolytic plating operation.

FIG. 4 shows the polymer after a final electrolytic plating operation over initial layer 20. The electrolytic plating operation forms a second metal layer 22 on the first layer 20. Layer 22 can be the same metal as layer 20, or a different metal, e.g. copper over copper, or nickel over copper.

The principal advantage of this embodiment is the employment of etchable non-metallic filler particles 14 in combination with metallic filler particles 16, whereby the non-metallic particles can be etched away to exposed the metallic filler particles for use as seed points and anchorages for the electroless plate layer 20. Metallic filler particles 16 facilitate deposition of the plating material; additionally, the metallic filler particles provide strong connection points between the plate and the substrate.

Figure 5:
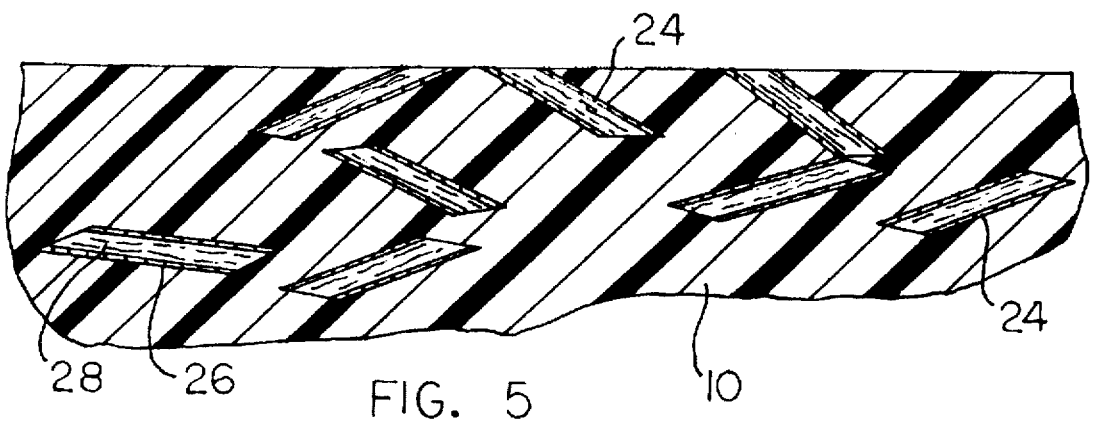
FIG. 5 is a view taken in the same direction as FIG. 1, but showing a polymer substrate having a different type of metallized filler.
Figure 6:
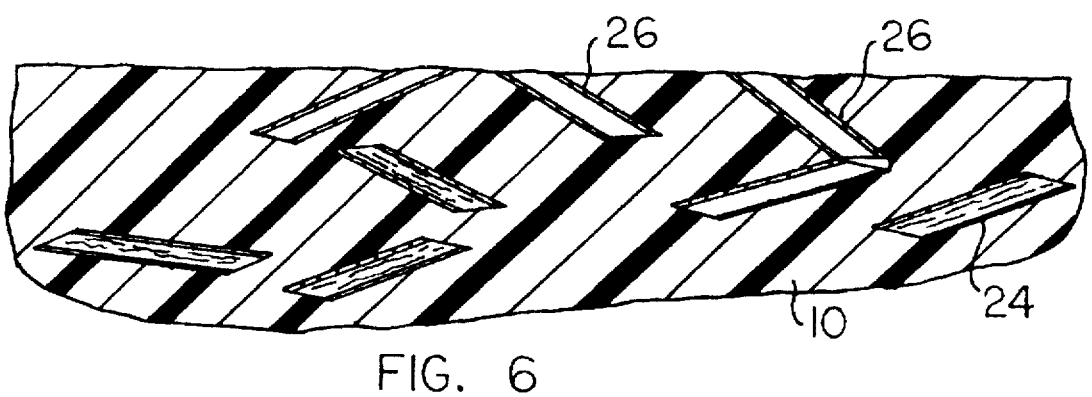
FIG. 6 is a view in the same direction (or at the same stage) as FIG. 2, but taken through the FIG. 5 polymer.

FIGS. 5 and 6 show another form of the invention, wherein the non-metallic filler particles and metallic filler particles are incorporated together as unitary composite particles, i.e. each filler particle has, a non-metallic etchable component and a metallic component.

Each filler element 24 comprises a metal coating 26 on a chopped glass fiber strand 28. The metal coating is applied to the strand prior to the chopping operation, so that the ends of the chopped strand are uncoated. This enables the etching solution to come into direct contact with the fiberglass portion of each chopped strand contiguous to the polymer surface, for removing the fiberglass from the filler element.

Metal coating 26 can be formed on the fiber glass strand in various ways, e.g. plating, vacuum metallizing, plasma arc spraying, or extrusion coating.

FIG. 6 shows the conditions of the filler particles after the etching operation. Glass fiber strand material in the filler elements contiguous to the polymer surface is removed, such that interior surfaces on the associated metal coating 26 are exposed for reaction with the electroless plating solution. The electroless plating operation and the subsequent electrolytic plating operation are carried out in the previously described fashion, as shown e.g. in FIGS. 3 and 4 of the drawings.

It will be noted from FIGS. 5 and 6 that the ends of the chopped strands are cut at acute angles to the strand axis. This is for the purpose of increasing the strand end surface area, to promote penetration of the etching solution into the glass fiber material.

Figure 7:
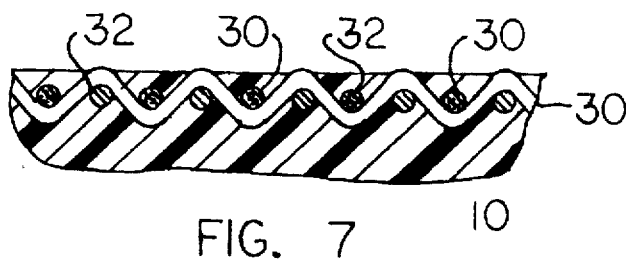
FIG. 7 is a fragmentary sectional view taken through another metallized filler arrangement embodying the invention.

FIG. 7 shows a further arrangement embodying the invention. In this case the non-metallic filler particles and metallic filler particles are formed by a woven cloth or roving containing non-metallic filaments 30 and metallic filaments 32. The filaments in each direction can be alternated so that the metallic filaments in one direction contact non-metallic filaments in the other direction.

The composite metal-nonmetal cloth is positioned on the polymer substrate so that surface areas of the polymer partially cover the cloth material, with areas of the cloth exposed. This enables the etching solution to contact the glass fiber strands, thereby removing such strands and forming cavities in direct contact with the metallic strands 32.

As with the previously described embodiments, the etched polymer is subjected to an electroless plating operation and an electrolytic plating operation. The exposed metal filaments 32 provide seed and anchorage points for the electroless plate layer.

It will be seen that the etchable filler particles and metal filler particles can be formed and combined together in various ways in order to carry out the invention. The invention can be practiced in various forms and Configurations.

What is claimed:

1. A process of plating a metal on a plastic substrate, wherein said substrate has an exposed surface, said process comprising:

incorporating etchable filler elements and etchant-resistant metal filler elements in the plastic substrate so that some etchable filler elements and some metal filler elements are continuous to the exposed surface of the substrate;

etching the exposed surface of the plastic substrate to selectively remove the contiguous etchable filler elements while leaving the contiguous metal filler elements exposed at the substrate surface; and plating a metal on the exposed surface of the substrate, using the exposed metal filler elements as anchorages for the plating material;

said metal plating step involving the sub-steps of electroless plating a first metal layer on the substrate, and electroplating a second metal layer on the first metal layer.

2. The process of claim 1, wherein the step of incorporating the filler elements in the plastic substrate involves combining the etchable elements and metal elements together to form composite filler elements.

3. The process of claim 1, wherein the etchable filler elements are fiberglass filaments, and the metal filler elements are metal coatings on the fiberglass filaments.

4. The process of claim 1, wherein the step of incorporating the filler elements in the plastic substrate involves forming metal coatings on fiberglass filaments and chopping the coated filaments to provide composite filler elements containing an etchable fiberglass component and an etchant-resistant metal component.

5. The process of claim 4, wherein the step of chopping the coated filaments involves cutting the coated filaments at acute angles to the filament axis, to thus increase the end surface area of the filament.

* * * * *